United States Patent
Delaine

(10) Patent No.: US 11,984,878 B2
(45) Date of Patent: May 14, 2024

(54) SWITCH AND ASSOCIATED ELECTRONIC DEVICE

(71) Applicant: Commissariat à l'énergie atomique et aux énergies alternatives, Paris (FR)

(72) Inventor: Johan Delaine, Grenoble (FR)

(73) Assignee: Commissariat à l'énergie atomique et aux énergies alternatives, Paris (FR)

(*) Notice: Subject to any disclaimer, the term of this patent is extended or adjusted under 35 U.S.C. 154(b) by 0 days.

(21) Appl. No.: 18/067,815

(22) Filed: Dec. 19, 2022

(65) Prior Publication Data

US 2023/0198515 A1    Jun. 22, 2023

(30) Foreign Application Priority Data

Dec. 21, 2021  (FR) .................................. 21 14066

(51) Int. Cl.
*H03K 17/0812* (2006.01)
*H03K 17/16* (2006.01)

(52) U.S. Cl.
CPC ..... *H03K 17/08122* (2013.01); *H03K 17/162* (2013.01)

(58) Field of Classification Search
CPC ......... H03K 17/0812; H03K 17/08122; H03K 17/16; H03K 17/161; H03K 17/162
USPC ................ 327/419, 427, 430, 434
See application file for complete search history.

(56) References Cited

U.S. PATENT DOCUMENTS

| 6,137,329 | A | 10/2000 | Kardash |
| 2006/0126253 | A1 | 6/2006 | Urakabe et al. |
| 2011/0148376 | A1 | 6/2011 | Xu et al. |
| 2020/0044635 | A1* | 2/2020 | Ju ............................ H03K 4/48 |
| 2021/0335781 | A1* | 10/2021 | Arnold ................ H01L 29/1066 |
| 2021/0336617 | A1* | 10/2021 | Shen .................. H03K 17/0822 |
| 2023/0050918 | A1* | 2/2023 | Udrea ................... H01L 29/205 |

FOREIGN PATENT DOCUMENTS

WO    WO 2019/084899 A1    5/2019

OTHER PUBLICATIONS

Extended European Search Report dated May 3, 2023 in European Patent Application No. 22214899.1 (with English translation of Category of Cited Documents), 8 pages.
French Preliminary Search Report dated Jun. 28, 2022 in French Application 21 14066 filed on Dec. 21, 2021 (with English Translation of Categories of Cited Documents), 3 pages.

\* cited by examiner

*Primary Examiner* — William Hernandez
(74) *Attorney, Agent, or Firm* — Oblon, McClelland, Maier & Neustadt, L.L.P.

(57) ABSTRACT

A switch including a transistor to be protected, and a Miller effect protection unit including a protection transistor, the drain of the protection transistor being connected to the gate of the transistor to be protected, the source of the protection transistor being connected to the source of the transistor to be protected, a linking circuit, the linking circuit being a high-pass filter arranged between the gate of the protection transistor and the drain of the transistor to be protected, and a control circuit interposed between the gate of the protection transistor and the source of the transistor to be protected.

7 Claims, 3 Drawing Sheets

SWITCH AND ASSOCIATED ELECTRONIC DEVICE

This patent application claims the benefit of document FR 21/14066 filed on Dec. 21, 2022, which is hereby incorporated by reference.

The present invention relates to a switch. It also relates to an electronic device comprising such a switch.

Some types of fast-switching power transistors are subject to self-switching due to the Miller effect. Such phenomena occur when the voltage between the drain and the source of the power transistor increases rapidly, inducing a potential rise in the gate voltage which can lead to a resumption of conduction and a temporary short-circuit.

To remedy this problem, several solutions are known in the prior art.

WO201984899 A1 provides a drive circuit for a switch, the drive circuit comprising a voltage sensor to sense a drive voltage and an electrical source to provide a drive signal having a drive value. The drive circuit is designed to set the drive value based on the drive voltage to limit a switching current flowing through the switch.

Such a circuit eliminates gate rises, but at the expense of switching losses.

There are also techniques that propose transistor manufacturing methods to adjust the capacitance values between the electrodes of the transistor to result in better natural immunity.

However, such a technique is relatively complex to implement.

There is therefore a need for a switch that is at least partially protected against the Miller effect with a technique that is easy to implement.

For this purpose, the description describes a switch having a transistor to be protected, the transistor to be protected comprising a gate, a drain and a source, the switch comprising a Miller effect protection unit, the protection unit comprising a protection transistor, the protection transistor having a gate, a drain and a source, the drain of the protection transistor being connected to the gate of the transistor to be protected, the source of the protection transistor being connected to the source of the transistor to be protected. The switch comprises a linking circuit, the linking circuit being a high-pass filter for the leakage current of the transistor to be protected, the linking circuit being arranged between the gate of the protection transistor and the drain of the transistor to be protected. The switch comprises a control circuit, the control circuit being interposed between the gate of the protection transistor and the source of the transistor to be protected.

According to particular embodiments, the switch has one or more of the following features taken in isolation or in any combination that is technically possible:
- the linking circuit is a capacitor.
- the control circuit is formed by a Zener diode in parallel with a resistor.
- the control circuit is formed by a discharge transistor and a drive unit of the discharge transistor.
- the drive unit comprises a resistor bridge comprising a midpoint, a first resistor and a second resistor, the drive unit also comprising a capacitor in parallel with the first resistor, the midpoint being connected to the gate of the discharge transistor.
- the transistor to be protected is made of gallium nitride or silicon carbide.
- the protection unit and the transistor to be protected are implemented on the same chip.
- each transistor has a size, the ratio between the size of the protection transistor and the size of the transistor to be protected being less than or equal to 0.1.

The description also describes an electronic device comprising a switch as described above.

In a particular embodiment, the electronic device further comprises a voltage source and a bridge arm formed by a transistor and the switch.

Characteristics and advantages of the invention will become apparent upon reading the following description, given only as a nonlimiting example, referring to the attached drawings, in which.

Figure 1:
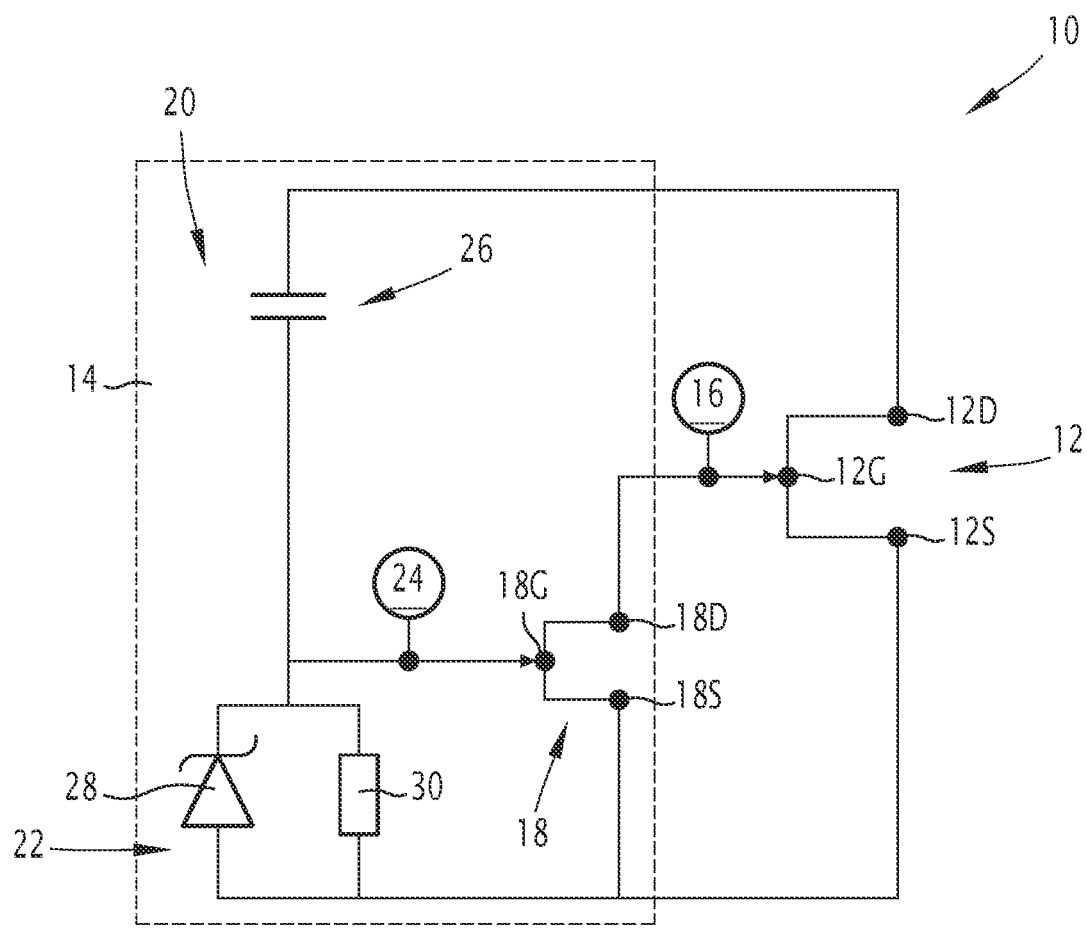
FIG. 1 is a diagram of an example switch.

An example switch 10 is diagrammed in FIG. 1.

A switch 10 is, by definition, an electronic component suitable for switching.

The switch 10 comprises a transistor 12 to be protected and a Miller effect protection unit 14.

In the example described, the transistor to be protected 12 and the protection unit 14 are implemented on the same chip.

In other words, the protection unit 14 is monolithically integrated with the transistor to be protected 12 to form a single component which is the switch 10, which ultimately corresponds to a controlled Miller effect transistor.

The transistor to be protected 12 is subject to the Miller effect. This usually means that the transistor has a very high switching speed, i.e. a switching speed of 50 kV/μs or more.

The transistor to be protected 12 is, for example, a high-electron mobility transistor (more often referred to as an HFMT).

Alternatively, the transistor to be protected 12 is an insulated gate bipolar transistor (more often referred to as an IGBT).

The transistor to be protected 12 is, for example, made of Gallium Nitride (GaN) or Silicon Carbide (SiC).

The transistor to be protected 12 has three electrodes, a gate 12G, a drain 12D and a source 12S.

The gate 12G of the transistor to be protected 12 is supplied with a control voltage 16.

The protection unit 14 is intended to protect the transistor to be protected 12 from the Miller effect.

Such protection may be absolute or relative, i.e. the protection unit 14 may reduce or cancel the Miller effect as appropriate, i.e. reduce the magnitude of the Miller effect at least in part.

The protection unit 14 could thus be called a "Miller clamp circuit" as it is sometimes called.

The protection unit 14 comprises a protection transistor 18, a linking circuit 20 and a control circuit 22.

The protection transistor 18 also has three electrodes, namely a gate 18G, a drain 18D and a source 18S.

The protection transistor 18 is such that the protection transistor 18 is much smaller in size than the transistor to be protected 12.

The size of a transistor is, for example, defined as the area occupied by the transistor on the chip on which the transistor is made in the chosen manufacturing technology.

Alternatively, the size of a transistor can also be obtained by measuring the on-state value of the transistor. Indeed, the value of the on-state of a transistor is related to the area occupied by the transistor gate.

Thus, the ratio between the size of the protection transistor 18 and the size of the transistor to be protected 12 is less than or equal to 0.1.

In addition, the protection transistor 18 has an on-state having a value less than the impedance of the capacitance $C_{GS}$ at the equivalent frequency of the drain-source voltage edge (capacitance between gate 12G and source 12S) of the transistor 12 to be protected.

The drain 18D of the protection transistor 18 is connected to the gate 12G of the transistor to be protected 12.

The term "connected" is used here to mean that the potential of the drain 18D protection transistor 18 and the potential of the gate 12G of the transistor to be protected 12 are identical due to a conductive element connecting the two electrodes.

The source 18S of the protection transistor 18 is also connected to the source 12S of the transistor to be protected 12.

The gate 12G of the transistor to be protected 12 is connected to a first gate clamp 16 and similarly, the gate 18G of the protection transistor 18 is connected to a second gate clamp 24, the two gate clamps 16 and 24 being separate.

A gate clamp is used to clamp the voltage between the gate and the source, i.e. to limit it.

In this case, each gate clamp 16 or 24 comprises a transistor.

In contrast to a conventional diode, which only allows current to flow in one direction, the forward direction, Zener diodes are designed to allow reverse current to flow as well, but only if the voltage at its terminals is higher than the avalanche breakdown threshold.

According to the proposed example, the Zener diode has a Zener voltage equal to the control voltage of the protection transistor 18.

For example, the control voltage of a protection transistor 18 which is a GaN HEMT is 5 volts (V).

According to another example, for a protection transistor 18 which is a MOSFET (acronym for Metal Oxide Semiconductor Field Effect Transistor) made of SiC, the control voltage is between 10 V and 20 V.

The linking circuit 20 blocks the flow of direct or low frequency current. Thus, the linking circuit 20 allows a high-frequency current flow to the control circuit 22.

In this case, the linking circuit 20 is a high-pass filter for the leakage current of the transistor to be protected 12.

This prevents leakage at the transistor to be protected 12.

In the case described, the linking circuit 20 is a capacitor 26 arranged between the gate 18G of the protection transistor 18 and the drain 12D of the transistor to be protected 12.

More precisely, one terminal of the capacitor 26 is connected to the potential applied to the gate 18G of the protection transistor 18 and the other terminal of the capacitor 26 is connected to the potential applied to the drain 12D of the transistor 12 to be protected.

The capacitance of the capacitor 26 is adapted to the size of the protection transistor 18.

As an example, for a transistor to be protected 12 which has an on-state resistance of 50 mΩ (allowing this transistor to withstand 30 A) and a protection transistor 18 having an on-state resistance of 500 mΩ for a capacitance between gate 18G and drain 18D of 8 pF, the capacitance of the capacitor 26 may be chosen at a value of 9 pF.

The control circuit 22 serves to discharge (respectively charge) the protection transistor 18 and more specifically to discharge (charge) the gate 18G of the protection transistor 18.

The control circuit 22 is interposed between the gate 18G of the protection transistor 18 and the source 12S of the transistor to be protected 12.

In the case of FIG. 1, the control circuit 22 is formed by a Zener diode 28 in parallel with a resistor 30.

The Zener diode 28 is connected on the one hand to the potential applied to the gate 18G of the protection transistor 18 and on the other hand connected to the source 12S of the transistor 12 to be protected. The Zener diode 28 is connected so that it is in the off state when there is a positive voltage between the gate 18G of the protection transistor 18 and the source 12S of the transistor 12 to be protected.

Similarly, the resistor 30 is connected by one of its terminals to the potential applied to the gate 18G of the protection transistor 18 and connected by the other of its terminals to the source 12S of the transistor 12 to be protected.

The value of the resistor 30 is between 100Ω and 1000Ω. Such a value gives a good discharge capacity to the resistor 30.

To give an order of magnitude of all the values of the components that can be used for the switch 10, as a particular example, to protect a transistor having as electrical characteristics respectively 650 V (breakdown voltage), 30 A (current rating) and 50 mΩ (on-state resistance), the capacitor 26 has a capacitance of 11 pF, the resistor 30 has a resistance of 1000Ω and the Zeners diode 28 has a maximum current at 3 A and an RMS current of 120 mA at 1 MHz.

The operation of the protection circuit 14 will now be described.

The Miller effect is caused by a change in the voltage between the drain 12D and the source 12S of the transistor to be protected 12 with a large equivalent frequency.

The protection transistor 18 is used to maintain the voltage between the gate 12G and the source 12S at zero.

The origin of the effect is exploited to drive the protection transistor 18 with a voltage divider consisting basically of a capacitor 26 and a resistor 30.

The capacitor 26 does not allow DC or low frequency current to flow. This prevents leakage at the transistor to be protected 12.

The capacitor 26 also has a low impedance at the equivalent frequency of the voltage edge between the drain 12D and source 12S of the transistor to be protected 12.

Consequently, during a rapid transition of this voltage between the drain 12D and source 12S of the transistor to be protected 12, the protection transistor 18 will be driven by a voltage divider effect, i.e. by distributing the voltage between the drain 12D and source 12S of the transistor to be protected 12 to the terminals of the capacitor assembly 26 and the resistor 30.

In other words, the capacitor 26 allows part of the current induced by the voltage rise (dV/dt) across the transistor to be protected 12 to charge the gate 18G of the protection transistor 18.

The protection transistor 18 then switches to the on state.

Once the protection transistor 18 is in this state, its on-state resistance is in parallel with the capacitance $C_{GS}$ of the transistor 12 (between gate 12G and source 12S). As a result, the impedance between the 12G gate and the 12S source is reduced. As a result, the voltage between the gate 12G and the source 12S decreases by a bridge divider effect. Indeed, the impedance ratio Z_gate-drain/Z_gate-source increases (this ratio being respectively the ratio between the impedance between the gate 12G and the drain 12D and that between the gate 12G and the source 12S).

Thus, a rapid voltage rise charges a protection transistor 18 through the capacitor 26. When turned on, this protection transistor 18 has a minimum level of parasitic element and allows the evacuation of the charges that are temporarily stored in the gate 12G—source 12S capacitance of the transistor to be protected 12. This avoids re-conduction despite the rapid rise in voltage.

The protection unit 14 therefore uses the voltage rise rate that causes the Miller effect phenomenon to trigger itself and prevent the gate 12G-source 12S voltage from rising significantly.

Furthermore, the protection unit 14 is monolithically integrated with the transistor to be protected 12.

This makes it possible to be more precise in that the action is carried out synchronously with the appearance of the Miller effect and more responsive because very few parasitic elements are present between the protection unit 14 and the transistor to be protected 12.

Mitigating the Miller effect makes the transistor to be protected 12 more reliable and also allows it to switch faster (larger dV/dt) and therefore potentially generate less switching loss.

In addition, the protection unit 14 is passive and does not involve any dedicated control circuitry, making it easy to implement.

Figure 2:
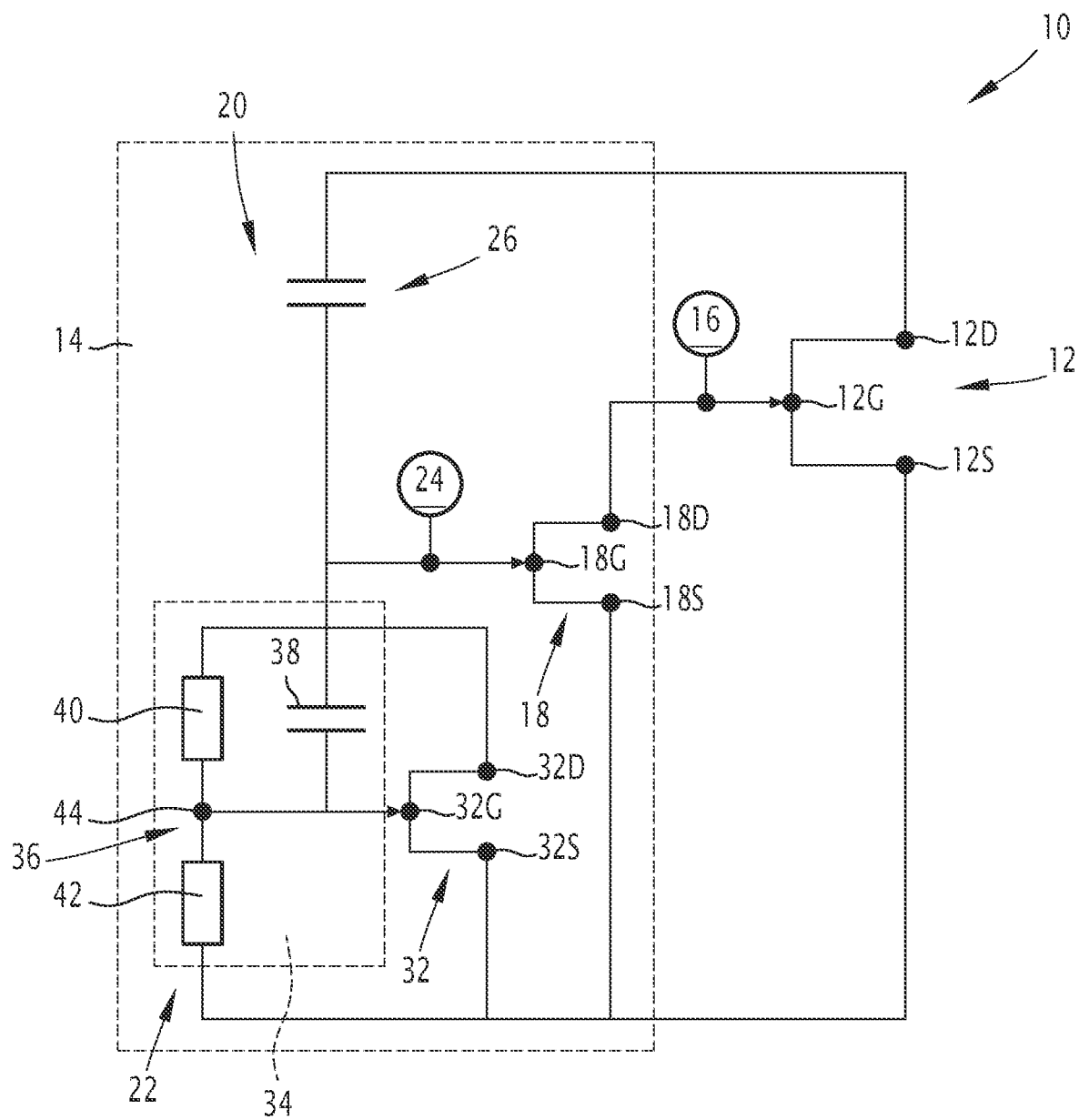
FIG. 2 is a diagram of another example switch.

Another example switch 10 is diagrammed in FIG. 2.

The common elements with the embodiment of FIG. 1 are not repeated here, only the differences are highlighted in the following.

The control circuit 22 is different here.

The control circuit 22 is formed by a control transistor 32 and a drive unit 34 of the control transistor 32.

The control transistor 32 also comprises three electrodes, namely a gate 32G, a drain 32D and a source 32S.

The control transistor 32 protects the gate 18G of the protection transistor 18.

The control transistor 32 is controlled by the drive unit 34. The drain 32D of the discharge transistor 32 is connected to the gate 18G of the protection transistor 18, the gate 32G of the discharge transistor 32 is connected to the drive unit 34, and the source 32S of the discharge transistor 32 is connected to the source of the other transistors 12 and 18.

In the case of FIG. 2, the control unit 34 comprises a resistor bridge 36 and a capacitor 38.

The resistor bridge 36 is a set of two resistors 40 and 42 in series.

The first resistor 40 is connected on the one hand to the capacitor 26 of the linking circuit 20 and on the other hand to the midpoint 44 of the resistor bridge 36, while the second resistor 42 is connected on the one hand to the midpoint 44 of the resistor bridge 26 and on the other hand to the source 32S of the discharge transistor 32.

The midpoint 44 is connected to the gate 32G of the discharge transistor 32.

The capacitor 38 is connected in parallel with the first resistor 40.

More precisely, the capacitor 38 is connected on the one hand to the capacitor 26 of the linking circuit 20 and on the other hand to the midpoint 44 of the resistor bridge 36.

The operation is relatively similar to that explained for the case in FIG. 1.

In addition, the two resistors 40 and 42 serve to discharge the gate 18G of the transistor to be protected 18 and form a voltage divider to drive the control transistor 32 if the voltage between the gate 18G and the source 18S of the transistor to be protected becomes too high.

The capacitor 38 allows the ratio of the high frequency voltage divider to be changed and allows the control transistor 32 to be triggered more quickly.

The switch 10 in FIG. 2 uses components that are more readily available today than the components of the control circuit 22 in FIG. 1.

This results in a significant gain in compactness. Typically, compared to an implementation of a Zener diode 28 by a plurality of diodes, a reduction of 50% of the area occupied on the chip can be achieved.

In addition, by using a discharge transistor 32 instead of the Zener diode 28 and driving it via a resistive divider bridge (resistor bridge 36) and a capacitor 38, the high-frequency dynamics of the switch 10 are improved.

In each of the above embodiments, the switch 10 can advantageously be used in an electronic device, and in particular a power electronic device.

Figure 3:
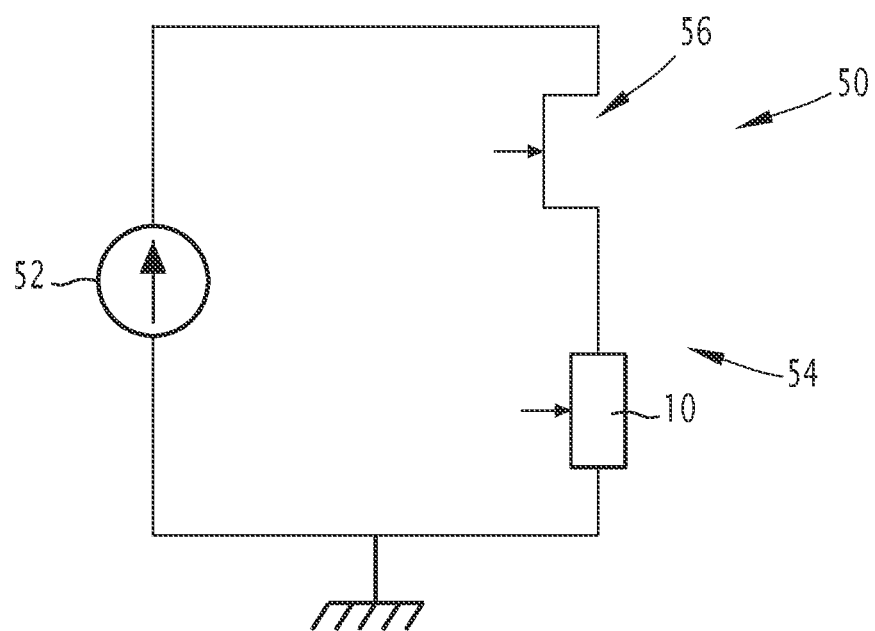
FIG. 3 is a diagram of an electronic device comprising a switch according to FIG. 1 or 2.

An example electronic device 50 is depicted in FIG. 3.

The electronic device 50 is here a converter typically used in power electronics.

In the example, the electronic device 50 comprises a voltage source 52 feeding a bridge arm 54.

The bridge arm 54 is formed by a transistor 56 and the switch 10 in series.

Alternatively, the bridge arm 54 may have the switch 10 first and then the transistor 56.

The invention claimed is:

1. A switch comprising:
a transistor to be protected, the transistor to be protected comprising a gate, a drain and a source, and
a protection unit against the Miller effect, the protection unit comprising:
a protection transistor, the protection transistor having a gate, a drain and a source, the drain of the protection transistor being connected to the gate of the transistor to be protected, the source of the protection transistor being connected to the source of the transistor to be protected,
a linking circuit, the linking circuit being a high-pass filter, the linking circuit being arranged between the gate of the protection transistor and the drain of the transistor to be protected, and
a control circuit, the control circuit being interposed between the gate of the protection transistor and the source of the transistor to be protected, the control circuit being formed by a discharge transistor and a drive unit of the discharge transistor, the drive unit having a resistor bridge comprising a midpoint, a first resistor and a second resistor, the drive unit also having a capacitor in parallel with the first resistor, the midpoint being connected to the gate of the discharge transistor.

2. The switch according to claim 1, wherein the linking circuit is a capacitor.

3. The switch according to claim 1, wherein the transistor to be protected is made of gallium nitride or silicon carbide.

4. The switch according to claim 1, wherein the protection unit and the transistor to be protected are realised on the same chip.

5. The switch according to claim 1, wherein each transistor has a size, the ratio between the size of the protection transistor and the size of the transistor to be protected being less than or equal to 0.1.

6. An electronic device comprising a switch according to claim 1.

7. The electronic device according to claim 6, wherein the electronic device further comprises a voltage source and a bridge arm formed by a transistor and the switch.

* * * * *